United States Patent [19]

Eisele et al.

[11] Patent Number: 5,105,433
[45] Date of Patent: Apr. 14, 1992

[54] INTERFEROMETRIC SEMICONDUCTOR LASER

[75] Inventors: Hartmut Eisele, Ostfildern/Ruit; Olaf Hildebrand, Stuttgart; Albrecht Mozer, Bietigheim; Michael Schilling; Heinz Schweizer, both of Stuttgart; Klaus Wünstel, Schwieberdingen; Ulrich Spalthoff, Stuttgart, all of Fed. Rep. of Germany

[73] Assignee: Alcatel N.V., Amsterdam, Netherlands

[21] Appl. No.: 582,639

[22] Filed: Sep. 14, 1990

[30] Foreign Application Priority Data

Sep. 22, 1989 [DE] Fed. Rep. of Germany ....... 3931588

[51] Int. Cl.$^5$ .................................. H01S 3/19
[52] U.S. Cl. ........................... 372/50; 372/45; 372/46; 372/98; 372/97; 372/99; 372/102; 385/4; 385/8; 385/2; 385/130
[58] Field of Search ............... 372/97, 98, 99, 102, 372/45, 46, 50, 20, 12, 28; 350/96.12, 96.13, 96.14

[56] References Cited

U.S. PATENT DOCUMENTS

| | | | |
|---|---|---|---|
| 4,331,938 | 5/1982 | Limm et al. | 372/50 |
| 4,737,962 | 4/1988 | Yamamoto et al. | 372/49 |
| 4,747,654 | 5/1988 | Yi-Yan | 350/96.19 |
| 4,860,294 | 8/1989 | Winzer et al. | 372/7 |
| 4,877,299 | 10/1989 | Lorenzo et al. | 350/96.14 |
| 4,878,727 | 11/1989 | Boiarski et al. | 350/96.17 |
| 4,888,785 | 12/1989 | Lee | 372/50 |

OTHER PUBLICATIONS

Numai, T., Murata, S. and Mito, I., "1.5 μm tunable wavelength filter using a phase-shift-controlled distributed feedback laser diode with a wide tuning range and a high constant gain," Appl. Phys. Lett. 54 (19), May 8, 1989, Am. Inst. of Physics, pp. 1859–1860.

Salzman, J., Appl. Phys. Lett. 52 (10) Mar. 7, 1988, Cross Coupled Cavity Semiconductor Laser, pp. 767–769.

Marcou et al., "Analysis of Bragg Grating Coupling Between Two Channel Waveguides Intersecting at a Right Angle," IEEE Journal of Quantum Electronics, vol. QE-22, No. 9, Sep. 1986, pp. 1557–1567.

Wu et al., "Wavelength tuning and switching of a coupled distributed feedback and Fabru–Perot cavity laser," J. Appl. Phys. 63 (2), Jan. 1988, pp. 291–294.

Wu et al., "Molecular-Beam-Epitaxy . . . Stepped--Channeled Substrates," Electronics Letters, vol. 21, No. 24, Nov. 1985, pp. 1138–1140.

Fattah et al., "Electrical Tuning of Semiconductor Interferometric Laser," Electronics Letters, vol. 19, No. 22, Oct. 1983, pp. 926–927.

Schilling et al., "Widely Tunable Y-Coupled Cavity Integrated Interferometric Injection Laser," Electronics Letters, vol. 26, No. 4, Feb. 1990, pp. 243–244.

*Primary Examiner*—Georgia Epps
*Attorney, Agent, or Firm*—Spencer & Frank

[57] ABSTRACT

A semiconductor laser which includes a controllable beam splitter has three segments including laser-active zones and a monitor diode forming a cross-shaped laser connected with one another by way of the beam splitter. The beam splitter is equipped with electrodes for controlling optical coupling between the segments.

10 Claims, 5 Drawing Sheets

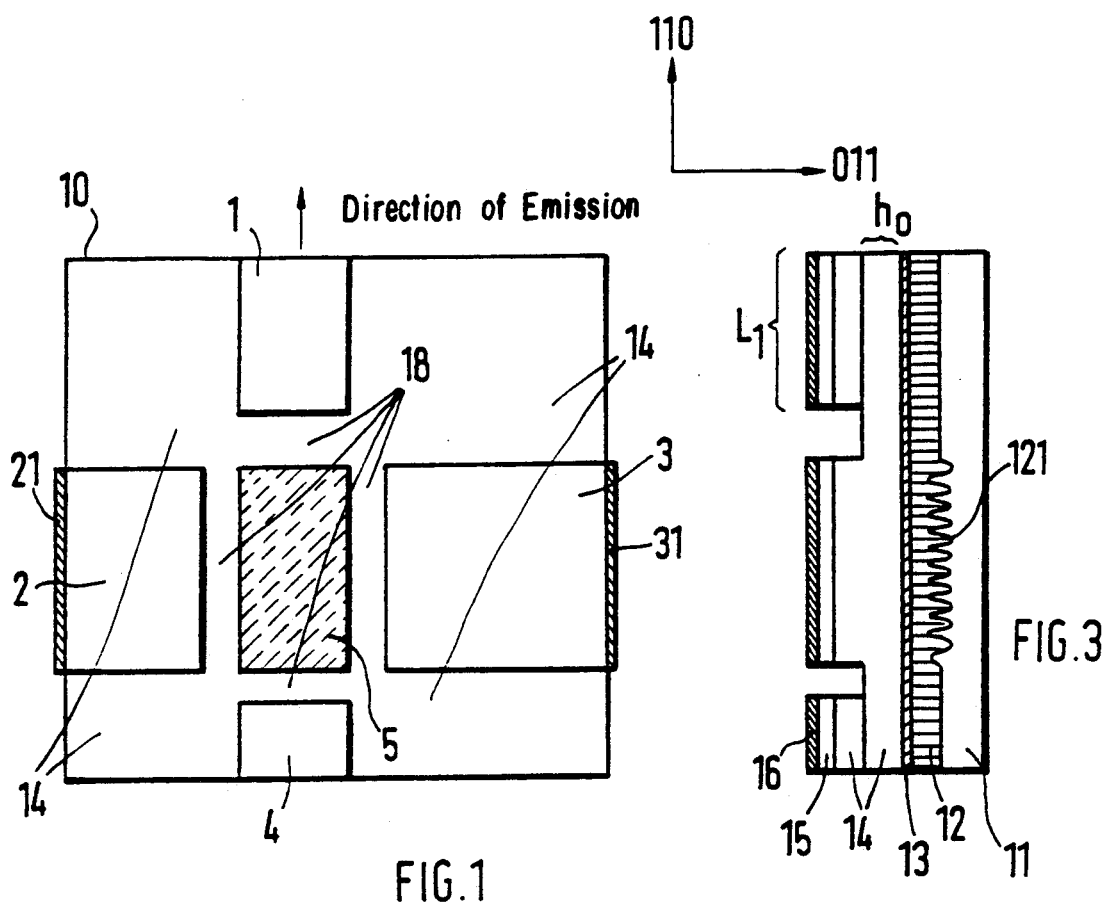
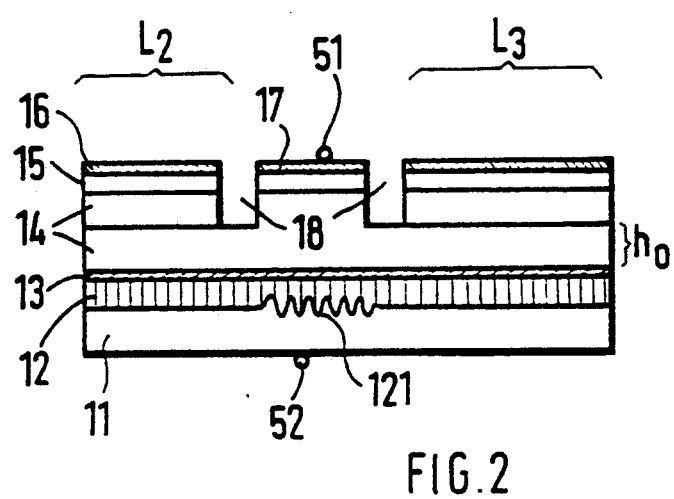

INTERFEROMETRIC SEMICONDUCTOR LASER

CROSS REFERENCE TO RELATED APPLICATION

This application claims the priority of Application Ser. No. P 39 31 588.6, filed Sept. 22, 1989, in the Federal Republic of Germany, the subject matter of which is incorporated herein by reference.

BACKGROUND OF THE INVENTION

The invention relates to an electrically tunable, interferometric semiconductor laser including at least three segments which abut on one another in one plane, are monolithically integrated on a semiconductor wafer, are each composed of at least one laser-active zone and have a mirror at their free ends, the semiconductor laser further including a beam splitter by means of which the segments are connected with one another.

An interferometric semiconductor laser is a semiconductor laser configured according to the principle of a Michelson or Mach-Zehnder interferometer. Compared to a laser including a Fabry-Pérot resonator, the interferometric semiconductor laser has the advantage that it emits in monomode operation while providing good suppression of side modes of the laser light. Moreover, when current is injected to change its optical length, this laser can be tuned through much more strongly than a laser including a DFB [distributed feedback] resonator. This makes it suitable for numerous applications: as a transmitting laser in multi-channel communications systems operating with wavelength multiplexing; as a local oscillator in coherent systems for the precise definition of channel wavelengths; and as a logic element. In the latter, the logic states "0" and "1" are represented by two wavelengths $\lambda_1$, $\lambda_2$.

From the publication entitled Appl. Phys. Lett. 52 (1988), pages 767-769, it is known to construct such a monolithically integrated, continuously tunable laser which is composed of at least three individual laser cavities that are controlled independently of one another by way of electrical contacts. Four segments acting as optical resonators form a cross-shaped laser at whose crosspoint a beam splitter is disposed at an angle of 45° with respect to one of the segments.

A semiconductor laser including only three segments having different lengths $L_1$, $L_2$, $L_3$ is constructed according to the same principle.

Such a semiconductor laser is produced on a (100) GaAs/GaAlAs double heterostructure by metalorganic gas phase epitaxy in which the segments are grown photolithographically in the [011] and [110] directions. Then the segments are coated with a dielectric material and electrodes are attached, the segments are metallized on the rear of the semiconductor substrate and split at their ends.

By bombardment with a gallium ion beam, narrow troughs are created at the point of connection of the three segments so as to form the beam splitter. The troughs extend down to a distance of 0.1 $\mu$m from the laser-active zone so that a non-negligible coupling is created between the segments.

Compared to the mode spectrum of an individual laser, the interferometric semiconductor laser, due to the different lengths $L_1$, $L_2$, $L_3$ of the three segments, results in greater amplification of every $n^{th}$ mode as follows:

$$\frac{(L_2 + L_3) - (L_1 + L_2)}{(L_2 + L_3) + (L_1 + L_2)} = \frac{1}{n}$$

In spite of the relatively long lengths $L_1$, $L_2$, $L_3$ of the individual segments, only the difference between the lengths of the laser cavities $(L_2+L_3)-(L_1+L_2)$ plays a role in the separation of the modes, while modes of a frequency difference of c/2L occur in a laser including a Fabry-Pérot resonator, where c is the speed of light and L the length of the laser cavity. Only if the laser is sufficiently short, will it oscillate at a single frequency. However, this interferometric semiconductor laser has the drawback that the frequency of the light it emits cannot be changed.

SUMMARY OF THE INVENTION

It is an object of the invention to provide a semiconductor laser of the above-mentioned type whose emission frequency is variable and which is suitable for optical data transmission, i.e. emits in a wavelength range of 1.3 $\mu$m and 1.55 $\mu$m.

This is accomplished in a semiconductor laser of the above-mentioned type in that the beam splitter is equipped with two electrodes through which, by way of a current, transmission and reflection of the laser light between the segments can be controlled.

Advantageous modifications are defined in the dependent claims. A semiconductor laser provided with quantum-well layer packets as laser-active zones is particularly advantageous since it has a planar surface and the separation between the beam splitter and the waveguides as well as the monitor diode is effected by implanting or diffusing in foreign atoms, thus changing the crystal structure. This process is called "selective disordering".

Another particularly advantageous modification includes a second beam splitter as well as three monitor diodes which serve to individually control phase, power and filter wavelength of the emitted laser light.

BRIEF DESCRIPTION OF THE DRAWINGS

The invention will now be described in greater detail with reference to embodiments thereof. It is shown in:

FIGS. 1 to 3, an interferometric semiconductor laser including a holographic grating as the beam splitter;

DETAILED DESCRIPTION OF THE PREFERRED EMBODIMENTS

Figure 4:
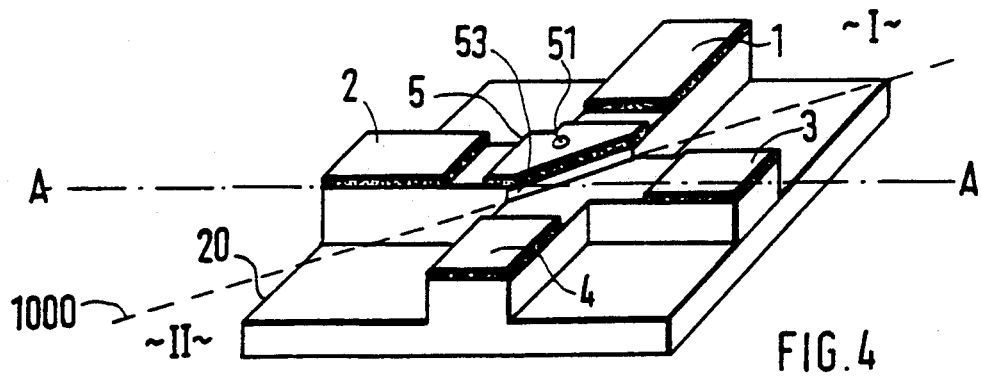
FIGS. 4 to 6, an interferometric semiconductor laser including an etched beam splitter.

An interferometric semiconductor laser (FIG. 1) is composed of three segments 1, 2, 3 and a monitor diode 4, which are arranged at a right angle to one another on a rectangular semiconductor chip 10. This chip is constructed on the basis of a semiconductor substrate 11 (FIG. 2).

Segments I, 2, 3 and monitor diode 4, composed of several superposed layers 12, ..., 16 (see FIG. 2) are connected with one another by way of a beam splitter 5. However, troughs 18 extend down to the depth of layer 14 (see FIG. 2) into the sequence of layers 11, . . . , 16 between segments 1 to 3 and monitor diode 4, on the one hand, and beam splitter 5, on the other hand.

Segments 2 and 3 extend in the [011] direction on semiconductor substrate 11 and their free ends are provided with reflective faces 21 and 31, respectively, which have been produced by etching or splitting the crystal faces. The usable laser light is emitted from segment 1 in the [110] direction.

The semiconductor substrate 11 of the semiconductor laser shown in cross section (FIG. 2) is composed of n-type indium phosphide. Either semiconductor substrate 11 or a buffer layer applied to it (not shown here) is provided with a holographic grating 121 in the region of beam splitter 5. The grating has a periodicity of the first or second order. Which one of the two periodicities is selected depends on the intended strength of the mutual coupling between waveguides 1 to 3. Above semiconductor substrate 11 or above the buffer layer, there follows layer 12 of n-type InGaAsP. It forms a waveguide zone which conducts light of a wavelength of 1.30 $\mu$m.

Above this layer lies layer 13 of un-doped InGaAsP; it constitutes the laser-active zone which is transparent for light of a wavelength of 1.55 $\mu$m.

Above layer 13, there follows layer 14 of p-type InP which also serves as covering layer and has a thickness of one micron. Layer 15 serves as contact layer; it is composed of p$^+$-type InGaAs and lies below metal layer 16.

In the longitudinal and transverse directions, layers 14 to 16 are interrupted by troughs 18 which laterally define beam splitter 5.

In the region of troughs 18 on the corner faces cut out of waveguides 1, 2, 3 and monitor diode 4, layer 14 has a height h$_0$. Below and above beam splitter 5, electrodes 51, 52 are disposed which, by way of the flow of current and the dependence of the refractive index on the charge carrier concentration, serve to control transmission and reflection of the holographic grating 121—and thus the coupling between waveguides 1 to 3. On metal layer 16 and below the semiconductor substrate, waveguides 1 to 3 and monitor diode 4 are also provided with electrodes (not shown here) by which they are controlled. Segments 1 to 3 are operated in the forward direction and the monitor diode in the reverse direction; the monitor diode controls the injection currents for waveguides 1 to 3 so as to change their light emission.

The modes of the emitted light may here be shifted over a wide range. The monomode emission may deviate up to 0.4% from the wavelength of 1.55 $\mu$m. And this deviation can be effected by continuous tuning of the injection currents.

In order to couple sufficient light into beam splitter 5, segments 2 and 3 have a width from 150 to 200 $\mu$m. In them, layer 13 forms a so-called "broad-area laser". However, the laser-active zone of segment 1 (FIG. 2) has only a width of 2 $\mu$m. It constitutes a ridge waveguide. Segments 1, 2, 3 have the lengths L$_1$, L$_2$, L$_3$, respectively (FIGS. 2, 3).

In another embodiment, the beam splitter 5 of an interferometric semiconductor laser 20 is provided with a partially transparent mirror 5 (FIG. 4) instead of the holographic grating. Such a semiconductor laser 20 is created in that on this side of an angle bisector 1000 passing through the surface corresponding to beam splitter 5, a region I has a lower surface than a region II on the other side of angle bisector 1000.

Figure 5:
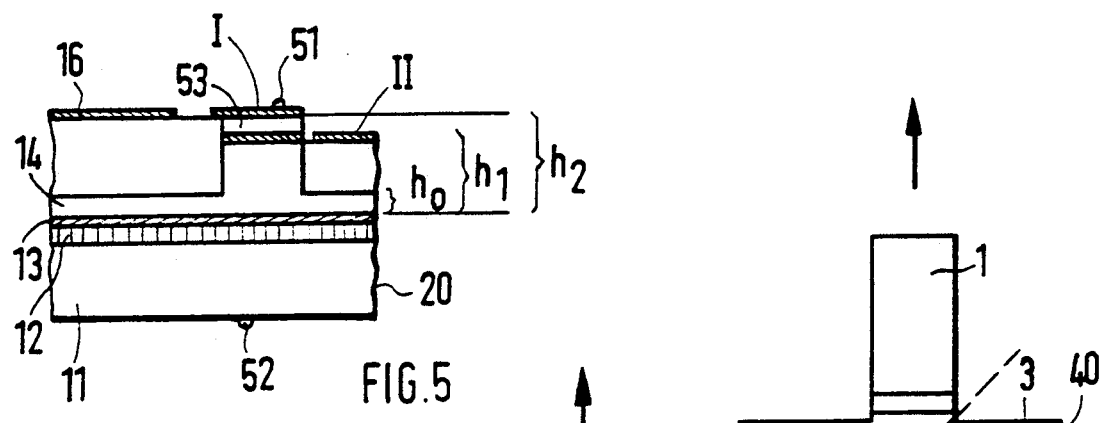

A sectional view (FIG. 5) corresponding to line A—A of FIG. 4 indicates that layer 14 in region I has a height h$_2$ in the region of segments 1 and 2 and on the one half of the area corresponding to beam splitter 5, a height h$_1$ in region II in the area of waveguide 3, monitor diode 4 and on the other half of beam splitter 5 and a height h$_0$ outside of segments 1-3, monitor diode 4 and beam splitter 5. A contact layer is not provided. Segments 1 to 3, monitor diode 4 and beam splitter 5 in region II are equipped with metal layer 16.

Figure 6:
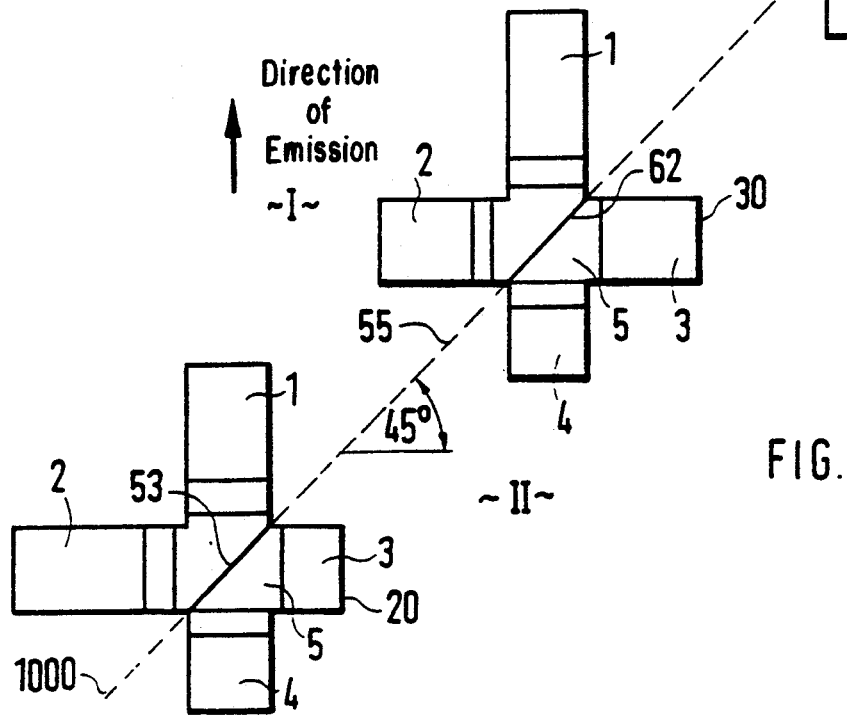

Several such identically constructed semiconductor lasers 20, 30, 40 (FIG. 6) are integrated on semiconductor substrate 11. They are offset relative to one another in the longitudinal and transverse direction so that the angle bisector 1000 of beam splitter 5 of semiconductor laser 20 also forms the angle bisector of the beam splitters 5 of the other two semiconductor lasers 10, 20, 30, 40. Since all beam splitters 5 have a square base cross section, they are intersected at an angle of 45°.

In this case, all segments 1, 2, 3 include a ridge waveguide laser each provided with two laser-active zones having a width up to 3 $\mu$m. Due to the different thicknesses of regions I and II, they have different refractive indices n$_I$ and n$_{II}$, respectively, which are averaged by way of semiconductor substrate 11 and layers 12 to 14. The difference in the refractive indices is a measure for the coupling of the laser light between segments 1 to 3. Depending on the desired coupling by beam splitter 5, layer 14 is etched to the corresponding height k$_1$.

On the basis of better coupling of the laser light between segments 1 to 3 offered by the etched beam splitter 5 compared to the holographic grating, segments 2 and 3 need not include any "broad-area lasers". Therefore, like segment 1, they include ridge waveguide lasers and have the same width as segment 1.

On the other hand, the coupling of light effected by beam splitter 5 between waveguides 1 to 3 cannot be controlled electrically. Rather it is firmly predetermined by the step difference between regions I and II.

Figure 7:
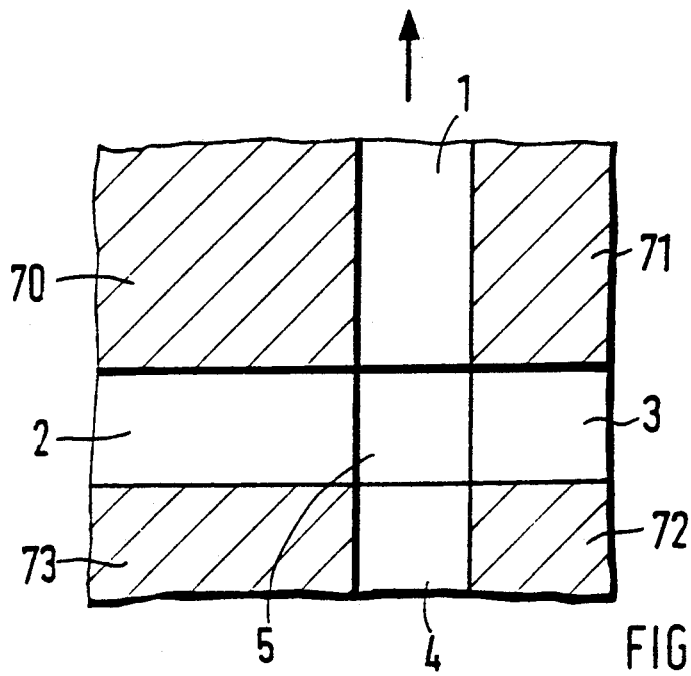
FIGS. 7 to 9, an interferometric semiconductor laser equipped with quantum-well lasers.

Instead of the double heterostructure employed in the ridge waveguide lasers of segments 1 to 3, a third embodiment is provided with multi-quantum-well layers of which ten to twenty are superposed on one another in each segment 1, 2, 3 (FIG. 7). Instead of a single laser-active zone in layer 13 (see FIG. 5) ten to twenty layers are provided which are composed, for example, alternatingly of InGaAsP and InP.

Figure 8:
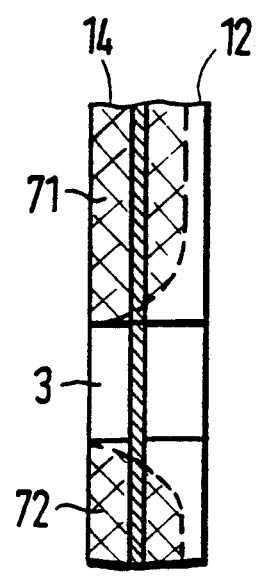

The production of such a semiconductor laser of multi-quantum-well layers is effected in that layer 12, the ten to twenty multi-quantum-well layers and layer 14 (FIG. 8) are epitaxially applied in succession on semiconductor substrate 11 or on a buffer layer (not shown here). Thereafter, the cross-shaped surface of the semiconductor laser is lithographically covered by a mask so that, in a subsequent implantation or diffusion step, the crystal structure exclusively of regions 70 to 73 (FIG. 7) is restructured by foreign atoms, e.g. zinc atoms or atoms of the material of which regions 70 to 73 are composed. Region II, as restructured by the atoms (FIG. 8), extends down to the depth of layer 12.

In a second implantation or diffusion step, the crystal structure of region I exclusively is re-ordered a second time by means of atoms. In this way, segment 3 and monitor diode 4 have a different refractive index than segments 1 and 2. In this case, the strength of the restructuring is determined by the coupling between segments 1 and 2, on the one hand, and segment 3, on the other hand.

Figure 10:
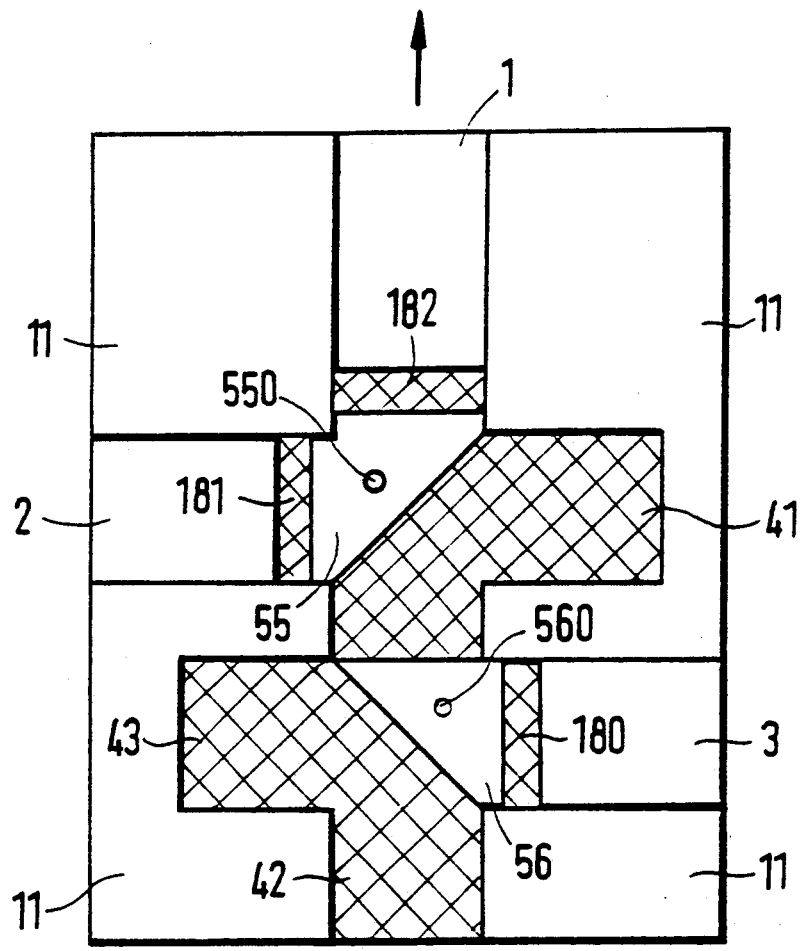
FIGS. 10 to 11, an interferometric semiconductor laser including two beam splitters.
Figure 11:
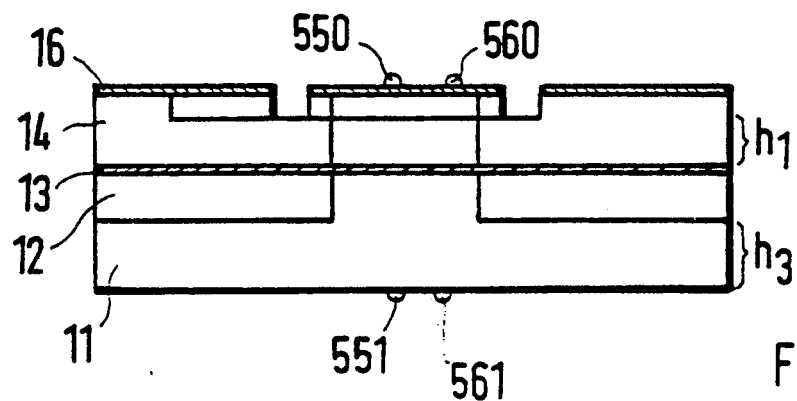

Another semiconductor laser includes two beam splitters 55, 56 (FIG. 10). These beam splitters couple light out of segments 1 to 3 into three monitor diodes 41, 42 43. Monitor diode 41 controls the phase of the laser light. It regulates the current injected into waveguides 2 and 3. Monitor diode 42 controls the power of the laser light in that it regulates the intensity of the current injected into segment 1. The current generated by monitor diode 43 for regulation of the filter wavelength is also injected into segment 1. Beam splitters 55, 56 and segments 1 to 3 are separated from one another and from monitor diodes 41 to 43 by troughs 180 to 182 extending from the surface down to layer 14 which there has a height $h_1$ (FIG. 11). Both beam splitters are provided with electrodes 550, 551 and 560, 561, respectively, by way of which the coupling can be controlled. Segments 1 to 3 and beam splitters 55, 56 are provided with a metal layer 16 (see also FIG. 2). Outside of segments 1 to 3, beam splitters 55, 56, monitor diodes 41 to 43 and troughs 180 to 182 disposed between them, there exists only the semiconductor substrate 11 whose surface has been partially etched away and there has a height $h_3$.

Figure 9:
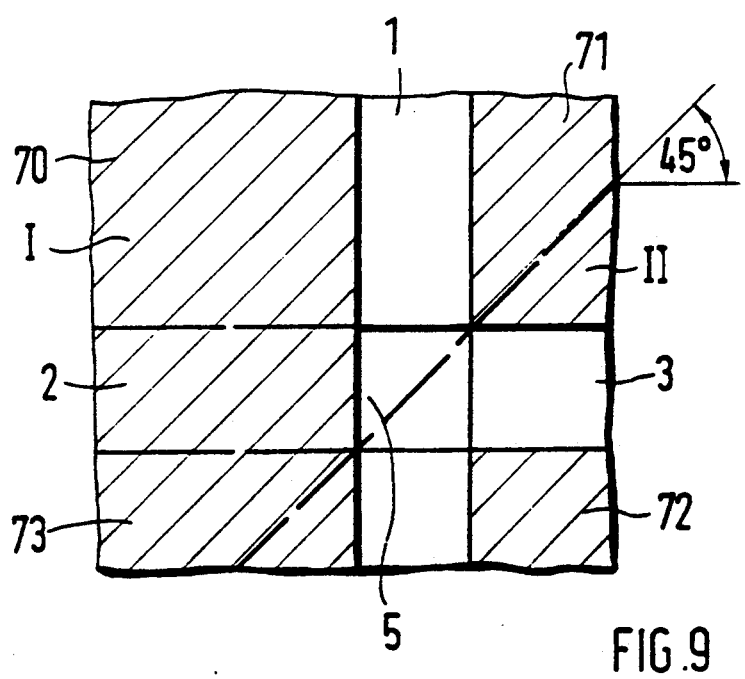

Instead of the layer structure according to FIG. 2, a semiconductor layer including two beam splitters 55, 56 can also be realized with quantum-well lasers (see FIG. 9).

Such a semiconductor laser including quantum-well lasers can be produced particularly economically. All control signals required for the laser light are furnished by the integrated monitor diodes 41 to 43; there is no external control.

Figure 12:
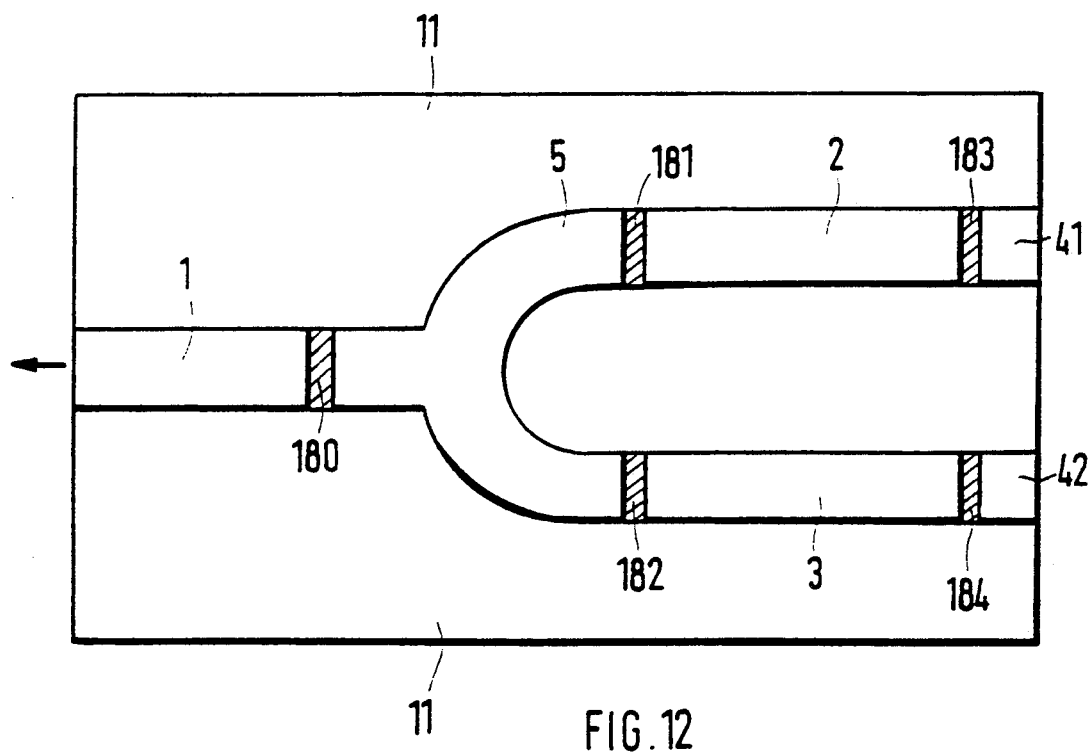
FIG. 12, an interferometric semiconductor laser including a Y coupler.

Another semiconductor laser that is integrated on a semiconductor substrate 11 (FIG. 12) includes a beam splitter 5 in the form of a "Y" which connects segments 1 to 3 with one another and is separated from them by troughs 180 to 182. Segments 2 and 3, in turn, are separated from monitor diodes 41, 42 by troughs 183, 184.

It will be understood that the above description of the present invention is susceptible to various modifications, changes and adaptations, and the same are intended to be comprehended within the meaning and range of equivalents of the appended claims.

What is claimed is:

1. An electrically tunable, interferometric semiconductor laser including:
    at least three segments monolithically integrated on a semiconductor wafer and each provided with at least one laser-active zone and a mirror at an end; and
    beam splitter means disposed between said at least three segments for optically connecting said segments with one another, said beam splitter means having two electrodes for controlling the transmission and refection of laser light between said segments.

2. A semiconductor laser according to claim 1, wherein said beam splitter means includes a holographic grating.

3. A semiconductor laser according to claim 1, wherein said beam splitter means is configured as a Y coupler.

4. A semiconductor laser according to claim 2, wherein one of said at least three segments is provided with a ridge waveguide laser; and
    two others of said at least three segments are each provided with a broad-area laser.

5. A semiconductor laser according to claim 1, wherein each one of said at least three segments includes a ridge waveguide laser.

6. A semiconductor laser according to claim 1, wherein a monitor diode is provided at right angles with two of said at least three segments for controlling the laser light output power.

7. A semiconductor laser according to claim 6, wherein said beam splitter means includes a partially transparent mirror having a vertical surface, and wherein said beam splitter means has a first and a second half, each half having a horizontal surface of a different height, the height of said first surface placing said first surface in a plane with two of said at least three segments and the height of said second surface placing said second surface in a plane with a third of said at least three segments and said monitor diode.

8. An arrangement wherein a plurality of semiconductor lasers according to claim 7 are provided on a single substrate disposed so that the surfaces of their beam splitter means mirrors lie in a straight line.

9. A semiconductor laser according to claim 1, wherein said at least three segments are provided with quantum-well lasers.

10. A semiconductor laser according to claim 1, wherein said beam splitter means comprises two beam splitters; and said laser includes
    three monitor diodes for controlling phase, power and filter wavelength of the laser light, respectively.

* * * * *